(12) United States Patent
Wang et al.

(10) Patent No.: US 10,901,544 B2
(45) Date of Patent: Jan. 26, 2021

(54) DISPLAY SUBSTRATE AND METHOD OF MANUFACTURING THE SAME, DISPLAY DEVICE

(71) Applicant: BOE TECHNOLOGY GROUP CO., LTD., Beijing (CN)

(72) Inventors: Lei Wang, Beijing (CN); Shengji Yang, Beijing (CN); Minghua Xuan, Beijing (CN); Li Xiao, Beijing (CN); Pengcheng Lu, Beijing (CN); Dongni Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 72 days.

(21) Appl. No.: 16/250,504

(22) Filed: Jan. 17, 2019

(65) Prior Publication Data

US 2019/0294283 A1 Sep. 26, 2019

(30) Foreign Application Priority Data

Mar. 22, 2018 (CN) .......................... 2018 1 0242259

(51) Int. Cl.
*G06F 3/041* (2006.01)
*G06F 3/044* (2006.01)
*H01L 27/32* (2006.01)

(52) U.S. Cl.
CPC .......... *G06F 3/0412* (2013.01); *G06F 3/044* (2013.01); *H01L 27/323* (2013.01); *G06F 2203/04103* (2013.01)

(58) Field of Classification Search
CPC ........... H01L 27/3276; H01L 2251/568; H01L 51/5203; H01L 51/56; H01L 2224/05017; H01L 2224/05023; H01L 2224/05557; H01L 2224/05568; H01L 2224/05582; H01L 2224/32013; H01L 2224/32054; H01L 2251/558; H01L 27/3248; H01L 2251/5338; G06F 3/04164; G06F 3/0443; G06F 2203/04112; G06F 3/044; G06F 2203/04103; G06F 3/047; G06F 2203/04111; G06F 2203/04107; G06F 3/0446; G06F 3/045; G06F 3/0448; G06F 3/0445; G06F 3/041; G06F 2203/04106; G06F 3/0447; G02F 2001/13629; G02F 1/136227; G02F 1/136286; G02F 1/1343
(Continued)

(56) References Cited

U.S. PATENT DOCUMENTS

| 2008/0314626 A1* | 12/2008 | Moore | .................. H01J 17/04 174/255 |
| 2014/0320761 A1* | 10/2014 | Misaki | ................. G06F 3/044 349/12 |
| 2015/0194470 A1* | 7/2015 | Hwang | ............... H01L 51/5225 345/173 |

* cited by examiner

Primary Examiner — Duc Q Dinh
(74) Attorney, Agent, or Firm — McDermott Will & Emery LLP (57) ABSTRACT

A display substrate includes a substrate, a plurality of electrode leads disposed on the substrate, and a plurality of electrodes electrically disconnected with each other disposed on the substrate. Each electrode is in direct contact with one or more of the plurality of electrode leads, and a thickness of each electrode lead is greater than a thickness of a corresponding electrode. At least one of the plurality of electrode leads is respectively provided with at least one gap, and each gap is configured to electrically disconnect one of the plurality of electrodes that is in direct contact with a corresponding electrode lead from another one of the plurality of electrodes that is adjacent to the corresponding electrode lead.

19 Claims, 6 Drawing Sheets

(58) Field of Classification Search
USPC .................... 345/173–175; 178/18.01–18.03
See application file for complete search history.

FIG. 15 ns filed on Mar. 22, 2018,

DISPLAY SUBSTRATE AND METHOD OF MANUFACTURING THE SAME, DISPLAY DEVICE

CROSS-REFERENCE TO RELATED APPLICATION

This application claims priority to Chinese Patent Application No. 201810242259.5, filed on Mar. 22, 2018, titled "A DISPLAY SUBSTRATE AND METHOD OF MANUFACTURING THE SAME, DISPLAY DEVICE", which is incorporated herein by reference in its entirety.

TECHNICAL FIELD

The present disclosure relates to the field of display technologies, and in particular, to a display substrate and a method of manufacturing the same, and a display device.

BACKGROUND

A touch screen is a touch sensing screen that can receive signals input by a stylus, a finger, etc. When the stylus or the finger touches a graphic button on the touch screen, a display device using the touch screen is triggered to perform a corresponding operation and display a corresponding result. As a new type of input device, the touch screen provides a simple, convenient and natural way of human-computer interaction.

With the continuous development of display and touch technologies, touch screens are becoming more widely used. For example, touch screens are applied to mobile communication devices (mobile phones, tablet personal computers, etc.), public information inquire terminals (business inquire terminals of departments such as banks and power companies), industrial controllers, and multimedia teaching devices.

Capacitive touch screens are common touch screens at the moment. A touch electrode layer in a capacitive touch screen includes a plurality of mutually insulated touch electrodes, and uses an induced current of a human body to work. When a user's finger touches a touch electrode in the capacitive touch screen, a coupling capacitance is formed between the finger and the touch electrode, and a controller in the display device calculates a precise position of the touch point according to the coupling capacitance, thereby triggering a corresponding operation.

SUMMARY

In a first aspect, a display substrate is provided. The display substrate includes a substrate, a plurality of electrode leads disposed on the substrate, and a plurality of electrodes electrically disconnected with each other disposed on the substrate. Each electrode is in direct contact with one or more of the plurality of electrode leads, and a thickness of each electrode lead is greater than a thickness of a corresponding electrode. At least one of the plurality of electrode leads is respectively provided with at least one gap, and each gap is configured to electrically disconnect one of the plurality of electrodes that is in direct contact with a corresponding electrode lead from another one of the plurality of electrodes that is adjacent to the corresponding electrode lead.

In some embodiments, each of the at least one of the plurality of electrode leads includes a first side face and a second side face opposite to each other, and a first surface disposed away from the substrate. The first side face and the second side face are parallel to a length direction of a corresponding electrode lead. An edge portion of an electrode in direct contact with the corresponding electrode lead covers the first side face and the second side face. The gap is provided in the second side face.

In some embodiments, each of the at least one of the plurality of electrode leads further includes a second surface close to the substrate, and an edge of the gap close to the substrate is located on the second surface.

In some embodiments, an edge of the gap away from the substrate is located on the first surface. Alternatively, there is a distance between the edge of the gap away from the substrate and the first surface.

In some embodiments, a surface defining the gap in each of the at least one of the plurality of electrode leads is a flat surface or a curved surface.

In some embodiments, the surface defining the gap in each of the at least one of the plurality of electrode leads is a curved surface, and the curved surface includes a first sub-curved surface and a second sub-curved surface. From an edge of the first sub-curved surface away from the substrate to an edge of the first sub-curved surface close to the substrate, the first sub-curved surface extends gradually in a direction away from a reference plane, wherein the reference plane is a plane passing through an edge of the gap away from the substrate and perpendicular to the substrate. From an edge of the second sub-curved surface close to the substrate to an edge of the second sub-curved surface away from the substrate, the second sub-curved surface extends gradually in the direction away from the reference plane.

In some embodiments, each of the plurality of electrode leads includes a single first conductive strip, and the gap is disposed in a side face of the first conductive strip.

In some embodiments, each of the plurality of electrode leads includes a plurality of conductive strips stacked on top of each other. Along a direction from a corresponding electrode to the substrate, densities of the plurality of conductive strips gradually decrease. Of the plurality of conductive strips, at least two conductive strips closest to the substrate are respectively provided with sub-gaps that are continuously distributed on side faces thereof, and the sub-gaps that are continuously distributed together form the gap.

In some embodiments, each of the plurality of electrode leads comprises a plurality of metal strips stacked on top of each other. Along a direction from a corresponding electrode to the substrate, reducibility of metals in the plurality of metal strips gradually increases. Of the plurality of metal layers, at least two metal layer closest to the substrate are respectively provided with sub-gaps that are continuously distributed in side faces thereof, and the sub-gaps that are continuously distributed together form the gap.

In some embodiments, each of the plurality of electrode leads comprises an insulating strip and at least one second conductive strip that are stacked on top of each other. The insulating layer is provided with the gap on a side face thereof.

In some embodiments, a ratio of resistivity to thickness of each electrode lead is smaller than a ratio of resistivity to thickness of an electrode in direct contact with the electrode lead.

In some embodiments, in a thickness direction of the substrate, a height of the gap is 1000~4000 Å, and a thickness of the electrode is 100~150 Å.

In some embodiments, the display substrate is a self-luminous display substrate. The self-luminous display substrate includes a first electrode layer, a luminous functional layer, and a second electrode layer that are sequentially arranged on the substrate. The plurality of electrodes are electrodes in the second electrode layer.

In some embodiments, the second electrode layer also serves as a touch electrode layer, and the plurality of electrode leads also serve as touch electrode leads.

In another aspect, a display device is provided. The display device includes the display substrate described above.

In yet another aspect, a method of manufacturing the display substrate described above is provided. The method includes: forming a plurality of electrode leads on the substrate; forming at least one gap each in a corresponding one of at least one of the plurality of electrode leads; and forming a plurality of electrodes on the substrate formed with the plurality of electrode leads, wherein each electrode is in direct contact with at least one of the plurality of electrode leads, the thickness of each electrode lead is greater than a thickness of a corresponding electrode, and one of the plurality of electrodes that is in direct contact with the corresponding one of at least one of the plurality of electrode leads is electrically disconnected from another one of the plurality of electrodes that is adjacent to the corresponding one of at least one of the plurality of electrode leads.

In some embodiments, forming at least one gap each in a corresponding one of at least one of the plurality of electrode leads includes: forming a single layer of conductive thin film or multiple layers of conductive thin films on the substrate, and etching the conductive thin film(s) to form first conductive strips; forming a layer of photoresist on the substrate formed with the first conductive strips, wherein the photoresist covers a portion of a portion of each of at least one of the first conductive strips in which a gap does not need to be formed, and exposes another portion thereof in which a gap needs to be formed; and etching the at least one of the first conductive strips to form the at least one gap.

In some embodiments, forming at least one gap each in a corresponding one of at least one of the plurality of electrode leads includes: forming multiple layers of metal thin films on the substrate, and etching the multiple layers of metal thin films to form metal strips; forming a layer of photoresist on the substrate formed with the metal strips, wherein the photoresist covers a portion of each of at least one of the metal strips in which a gap does not need to be formed, and exposes a portion thereof in which a gap needs to be formed; and etching the at least one of the metal strips to form the at least one gap.

In some embodiments, forming at least one gap each in a corresponding one of at least one of the plurality of electrode leads includes: sequentially forming a layer of insulating thin film and at least one layer of conductive thin film on the substrate, etching the at least one layer of conductive thin film to form second conductive strips, and etching the insulating thin film to form an insulating strips, wherein each second conductive strip is located on a side of a corresponding insulating strip away from the substrate; forming a layer of photoresist on the substrate formed with the second conductive strips, wherein the photoresist covers a portion of each of at least one of the second conductive strips and a portion of a corresponding one of at least one of the insulating strips in which a gap does not need to be formed, and exposes each of the at least one of the second conductive strips and a portion of the corresponding one of the at least one of the insulating strips in which a gap needs to be formed; and etching the at least one insulating strip to form the at least one gap.

BRIEF DESCRIPTION OF THE DRAWINGS

In order to describe technical solutions in embodiments of the present disclosure more clearly, the accompanying drawings to be used in the description of the embodiments will be introduced briefly. Obviously, the accompanying drawings to be described below are merely some embodiments of the present disclosure, and a person of ordinary skill in the art can obtain other drawings according to these drawings without paying any creative effort. The accompanying drawings are used to provide further understanding of the present disclosure and constitute a part of the present disclosure. The exemplary embodiments in the present disclosure and the descriptions thereof serve to explain the present disclosure, but do not constitute a limitation to the present disclosure. In the accompanying drawings.

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In some embodiments of the present disclosure, unless otherwise specified, "a plurality of" refers to two or more than two; "and/or" merely describes an association of associated objects, which include three situations. For example, "A and/or B" refers to three situations: A alone, A and B, and B alone. "First" and "second" are to distinguish between same or similar items whose functions and roles are substantially the same. Those skilled in the art understand that "first" and "second" do not limit a number and an order of execution, nor do they limit the "first" and "second" items to be different.

Figure 7A:
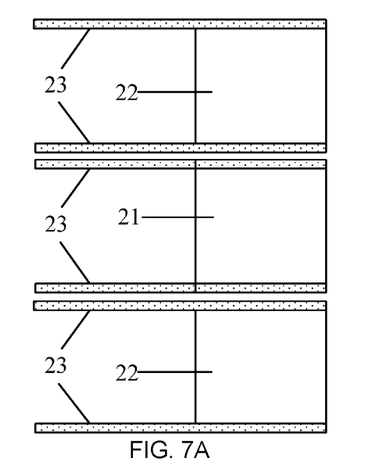
FIG. 7A is a plan view showing a partial structure of a display substrate according to some embodiments of the present disclosure, in which each electrode is in contact with two electrode leads.
Figure 9:
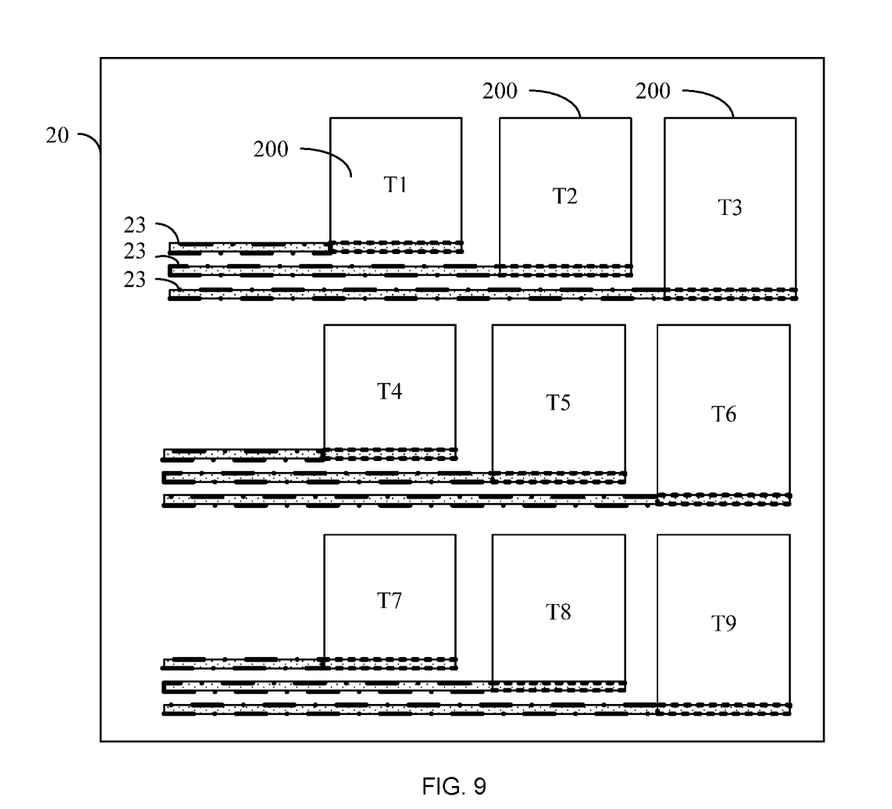
FIG. 9 is a plan view showing a partial structure of a display substrate according to some embodiments of the present disclosure, in which a plurality of electrodes are illustrated.

Some embodiments of the present disclosure provide a display substrate, and as shown in FIG. 9, the display substrate includes a substrate 20, a plurality of electrode leads 23 disposed on the substrate 20, and a plurality of electrodes 200 electrically disconnected with each other disposed on the substrate 20. FIG. 9 only shows 9 electrodes 200 (T1-T9) and 9 electrode leads 23, but the present disclosure is not limited thereto. Instead, m*n electrodes 200 and m*n electrode leads 23 may be disposed on the display substrate, wherein m and n are positive integers, m is greater than or equal to 1 (m≥1), and n is greater than or equal to 2 (n≥2). Each electrode 200 is in direct contact with one or more of the plurality of electrode leads 23. In some examples, as shown in FIG. 9, each electrode 200 is in direct contact with an electrode lead 23. In some other examples, as shown in FIG. 7A, each electrode 200 is in direct contact with two electrode leads 23. A thickness of each electrode lead 23 is greater than a thickness of a corresponding electrode 200. As shown in FIGS. 2-4 and 9, at least one of the plurality of electrode leads is respectively provided with at least one gap 100, and each gap 100 is configured to electrically disconnect an electrode (such as electrode T3) in direct contact with a corresponding electrode lead 23 from an electrode (such as electrode T6) adjacent to the corresponding electrode lead 23. Each electrode lead 23 is not limited to extend outward from left and right sides of the substrate 20, but may also extend from upper and lower sides of the substrate 20. In some embodiments, each electrode lead 23 is provided with a gap 100.

For convenience of description and to avoid unnecessary ambiguity, only two adjacent electrodes in the plurality of electrodes are selected for description below, for example, only electrodes T3 and T6 are selected for description. An electrode lead 23 in direct contact with the electrode T3 is adjacent to the electrode T6. For convenience of description, the electrode T3 is referred to as a first electrode 21 and the electrode T6 is referred to as a second electrode 22.

As shown in FIGS. 1-5, the first electrode 21 is adjacent to the second electrode 22, and a thickness of an electrode lead 23 in direct contact with the first electrode 21 is greater than a thickness of the first electrode 21. The electrode lead 23 in direct contact with the first electrode 21 is provided with a gap 100. Similarly, a thickness of an electrode lead 23 in direct contact with the second electrode 22 is greater than a thickness of the second electrode 22, and the electrode lead 23 in direct contact with the second electrode 22 is also provided with a gap 100. Alternatively, the electrode lead 23 in direct contact with the second electrode 22 is not provided with a gap 100. For convenience of description, the electrode lead 23 described blow generally refers to an electrode lead that is in direct contact with the first electrode 21, unless otherwise specified.

In some embodiments, the electrode lead 23 includes a first lead segment 231 and a second lead segment 232. The first electrode 21 is in direct contact with the first lead segment 231. The first lead segment 231 includes a first side face 2311 and a second side face 2312 opposite to each other, and a first surface 2313 disposed facing away from the substrate 20. The first side face 2311 and the second side face 2312 are parallel to a length direction of the electrode lead 23 (i.e., a left-right direction in FIG. 1). An edge portion of the first electrode 21 close to the second electrode 22 covers the first side face 2311 and the first surface 2313. A cross-sectional shape of the first lead segment 231 is substantially trapezoidal or substantially rectangular. But the present disclosure is not limited thereto. For example, the cross-sectional shape of the first lead segment 231 is a substantially arc shape, such as a substantially semi-circular shape.

Figure 2:
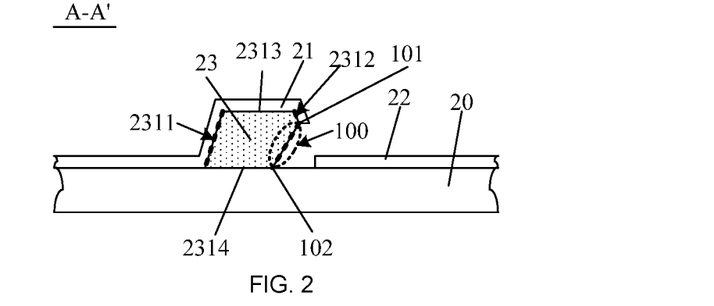
FIG. 2 is a first cross-sectional view taken along line A-A' in FIG. 1.
Figure 3:
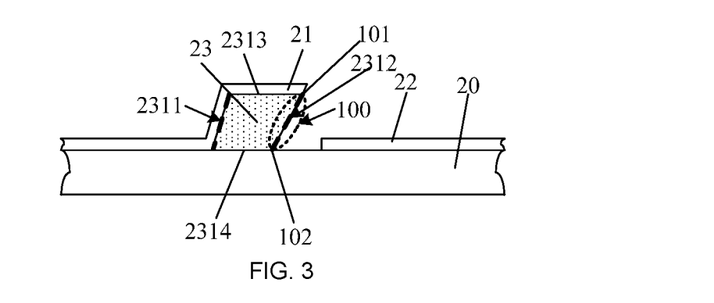
FIG. 3 is a second cross-sectional view taken along line A-A' in FIG. 1.
Figure 4:
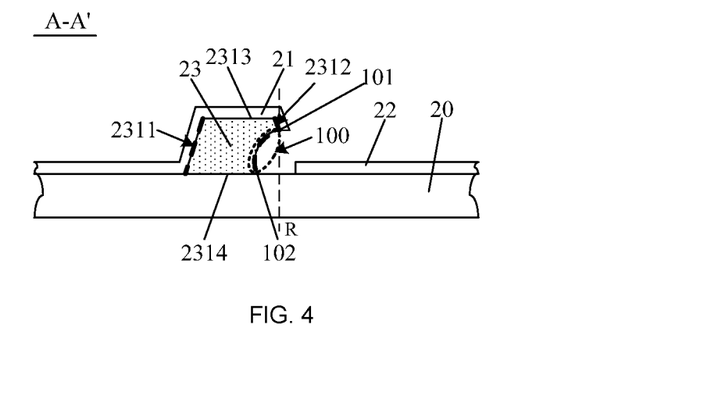
FIG. 4 is a third cross-sectional view taken along line A-A' in FIG. 1.
Figure 5:
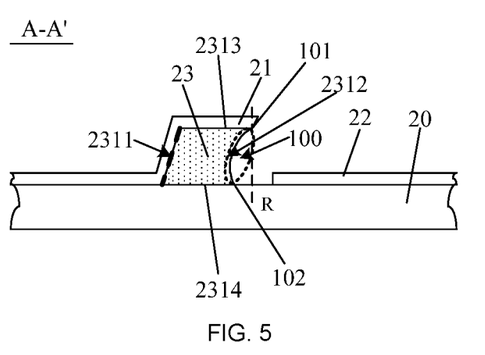
FIG. 5 is a fourth cross-sectional view taken along line A-A' in FIG. 1.

The gap 100 is provided in the second side face 2312. A position of the gap 100 in the second side face 2312 is different depending on a process used. For example, as shown in FIGS. 3 and 5, an edge 101 of the gap 100 away from the substrate 20 is located on the first surface 2313. Alternatively, as shown in FIGS. 2 and 4, there is a distance between the edge 101 of the gap 100 away from the substrate 20 and the first surface 2313.

In some embodiments, there is a distance between the edge 101 of the gap 100 away from the substrate 20 and the first surface 2313, and the second side face 2312 further includes a surface connecting the first surface 2313 with the edge 101 of the gap 100 away from the substrate 20. An angle between the first surface 2313 and the surface connecting the first surface 2313 with the edge 101 of the gap 100 away from the substrate 20 is in a same range as an angle between the first surface 2313 and the first side face 2311, which is [90°, 165°]. For example, the angle is 90°, 100°, 110°, 120°, 130°, 140°, 150°, or 160°.

In actual mass production, in order to reduce manufacturing difficulty, in some embodiments, the angle between the first surface 2313 and the first side face 2311 is in a range of [120°, 150°]. For example, the angle is 120°, 130°, 140°, or 150°.

In some embodiments, the electrode lead 23 further includes a second surface 2314 adjacent to the substrate 20, and an edge 102 of the gap 100 close to the substrate 20 is located on the second surface 2314. In this way, the first electrode 21 and the second electrode 22 may be completely electrically disconnected.

Figure 6:
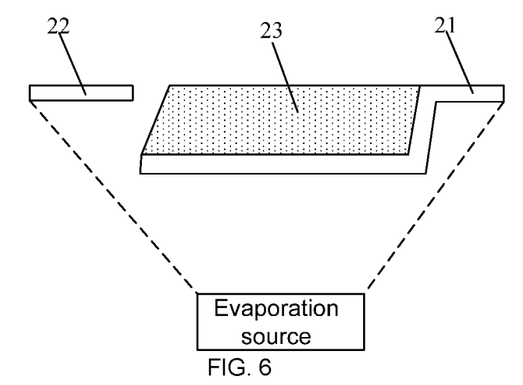
FIG. 6 is a schematic diagram showing a first electrode and a second electrode according to some embodiments of the present disclosure.

Since the second side face 2312 of the first lead segment 231 is provided with a gap 100, as shown in FIG. 6, when using an evaporation source to form the first electrode 21 and the second electrode 22 on the substrate 20 formed with an electrode lead 23 by means of evaporation, a shadow region is formed in a region where the gap 100 is located. Due to existence of the gap 100, it is impossible for conductive materials to be evaporated into the shadow region. Thus, the first electrode 21 and the second electrode 22 are electrically disconnected from each other in a position corresponding to the shadow region. In order to ensure that the shadow region formed by the gap 100 is large enough, it is arranged that the thickness of the electrode lead 23 is greater than the thickness of the first electrode 21, so that the first electrode 21 and the second electrode 22 are electrically disconnected from each other in the position corresponding to the shadow region.

In the display substrate provided by the embodiments of the present disclosure, as shown in FIGS. 2-5, the first electrode 21 and the second electrode 22 are electrically disconnected from each other by the electrode lead 23, and since the thickness of the electrode lead 23 is greater than the thickness of the first electrode 21, a distance between the first electrode 21 and the second electrode 22 is large in a longitudinal direction (a direction perpendicular to the display substrate, such as the up-down direction in FIG. 2), so that the first electrode 21 and the second electrode 22 are electrically disconnected from each other. In addition, a distance between the first electrode 21 and the second electrode 22 is small in a horizontal direction (a direction parallel to the display substrate, such as the left-right direction in FIG. 2), and thus the number of the electrodes in the display substrate may be increased, thereby improving accuracy when the display substrate has a touch function.

Materials of the first electrode 21, the second electrode 22 and the electrode lead 23 are not limited herein, as long as the first electrode 21 is electrically connected to the electrode lead 23 by the first lead segment 231 that is in direct contact with the first electrode 21. For example, materials and thicknesses of the first electrode 21 and the second electrode 22 are the same. A material of the electrode lead 23 is the same as a material of the first electrode 21. Alternatively, the material of the electrode lead 23 is different from the material of the first electrode 21.

For example, the materials of the first electrode 21, the second electrode 22 and the electrode lead 23 are metal or transparent conductive materials such as indium zinc oxide (IZO).

A shape of the gap 100 and thicknesses of the electrode lead 23 and the first electrode 21 are not limited herein, as long as the gap 100 of the electrode lead 23 is big enough for the first electrode 21 and the second electrode 22 to be electrically disconnected from each other.

In some embodiments, from the edge 101 of the gap 100 away from the substrate 20 to the edge 102 of the gap 100 close to the substrate 20, a surface defining the gap 100 in the electrode lead 23 is gradually inclined toward the first side face 2311. For example, as shown in FIGS. 2 and 3, the surface defining the gap 100 in the electrode lead 23 is a continuous flat surface. For another example, as shown in FIGS. 4 and 5, the surface defining the gap 100 in the electrode lead 23 is a continuous curved surface. For yet another example, the gap 100 includes a plurality of sub-gaps, and a surface defining each sub-gap in the electrode lead 23 is a curved surface or a flat surface.

In some embodiments, as shown in FIG. 3, the surface defining the gap 100 in the electrode lead 23 is a continuous flat surface, and the angle between the surface and a surface of the electrode lead 23 adjacent to the substrate 20 (i.e., the second surface 2314) is in a range of [115°, 180°). That is, the angle is greater than or equal to 115°, and is smaller than 180°, such as 120°, 130°, 140°, 150°, 160°, or 170°.

In some embodiments, the surface defining the gap 100 in the electrode lead 23 is a continuous curved surface, and the curved surface only includes a first sub-curved surface. Alternatively, the curved surface includes the first sub-curved surface and a second sub-curved surface, the first sub-curved surface is away from the substrate 20, and the second sub-curved surface is close to the substrate 20. As shown in FIGS. 4 and 5, with a plane passing through the edge 101 of the gap 100 away from the substrate 20 and perpendicular to the substrate 20 as a reference plane R, from an edge 101 of the first sub-curved surface away from the substrate 20 to an edge of the first sub-curved surface close to the substrate 20, the first sub-curved surface extends gradually in a direction away from the reference plane R. From an edge 102 of the second sub-curved surface close to the substrate 20 to an edge of the second sub-curved surface away from the substrate 20, the second sub-curved surface extends gradually in the direction away from the reference plane R. An angle between the second surface 2314 of the electrode lead 23 and a plane passing through the edge 101 of the gap 100 away from the substrate 20 and the edge 102 of the gap 100 close to the substrate 20 is in a range of [115°, 180°). That is, the angle is greater than or equal to 115°, and is smaller than 180°, such as 120°, 130°, 140°, 150°, 160°, or 170°.

In some embodiments, in a thickness direction of the substrate 20, a height of the gap 100 ranges from 1000 Å to 4000 Å, and a thickness of the first electrode 21 and the second electrode 22 ranges from 100 Å to 150 Å. In this way, since a difference in thickness between the first electrode 21 and the electrode lead 23 is large, the shadow region formed by the gap 100 is also large, which is more advantageous for the first electrode 21 and the second electrode 22 to be electrically disconnected in the position corresponding to the shadow region.

For example, in the thickness direction of the substrate 20, the height of the gap 100 is 3000 Å, and the thickness of the first electrode 21 is 100 Å.

In the thickness direction of the substrate 20, the height of the gap 100 may be the same as or different from a maximum distance of the second side face 2312 to the substrate 20. In some embodiments, as shown in FIGS. 2 and 4, the height of the gap 100 is different from the maximum distance of the second side face 2312 to the substrate 20, and the height of the gap 100 is smaller than the maximum distance of the second side face 2312 to the substrate 20.

In some embodiments, since the first electrode 21 and the second electrode 22 are electrically disconnected from each other at a position of the gap 100 in the second side face 2312 of the electrode lead 23, and the first electrode 21 covers the electrode lead 23, "an edge portion" in "an edge portion of the first electrode 21 close to the second electrode 22" refers to a portion of the first electrode 21 that covers the first side face 2311 and the first surface 2313 of the electrode lead 23.

In some embodiments, a ratio of resistivity to thickness of the electrode lead 23 is smaller than a ratio of resistivity to thickness of the first electrode 21.

Since resistivity of aluminum, molybdenum, and copper is very small at about 0.01 Ω·μm, a thickness of the electrode lead 23 may be made as small as possible on a premise of ensuring that the first electrode 21 and the second electrode 22 are electrically disconnected from each other in the position corresponding to shadow region and that the ratio of resistivity to thickness of the electrode lead 23 is smaller than the ratio of resistivity to thickness of the first electrode 21. When the display substrate is applied to a display device, use of aluminum, molybdenum, or copper as a material of the electrode lead 23 facilitates thin design of the display device. Therefore, in some embodiments, the material of the electrode lead 23 includes at least one of aluminum, molybdenum, or copper.

In some embodiments, the thickness of the electrode lead 23 is greater than the thickness of the first electrode 21, and the electrode lead 23 and the first electrode 21 are made of different materials, so that the ratio of resistivity to thickness of the electrode lead 23 is smaller than the ratio of resistivity to thickness of the first electrode 21. In some cases, the ratio of resistivity to thickness of the electrode lead 23 is equal to the ratio of resistivity to thickness of the first electrode 21 (for example, the materials and thicknesses of the first electrode 21 and the electrode lead 23 are the same). It may be concluded from the resistance formula R=p*L/S (R represents a resistance of the electrode lead 23, p represents a resistivity of the electrode lead 23, L represents a length of the electrode lead 23 in an extending direction thereof, and S represents a cross-sectional area of the electrode lead 23) that the resistance of the electrode lead 23 provided by the embodiments of the present disclosure is smaller than the resistance of the electrode lead 23 in a case where the ratio of resistivity to thickness of the electrode lead 23 is equal to the ratio of resistivity to thickness of the first electrode 21. As a result, an IR drop on the first electrode 21 and the load are also smaller in the embodiments of the present disclosure, so that when the display substrate is applied to a display device, if the first electrode 21 is used as a certain electrode of the display device, a display performance of the display device may be improved. For example, if the display device is a touch display device, and the first electrode 21 is used as a touch electrode, a touch effect of the touch display device may be improved.

In some embodiments, the electrode lead 23 may have a variety of different structures depending on a number of layers and a material of the electrode lead 23. For example, the electrode lead 23 is implemented in several structures as follows, but it is not limited thereto, and may be implemented in other structures than the following several structures.

Figure 11A:
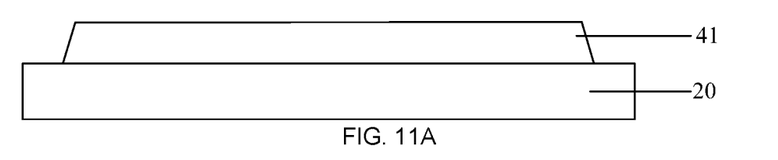
FIG. 11A is a first schematic diagram of a process of forming first conductive strips according to some embodiments of the present disclosure.
Figure 11B:
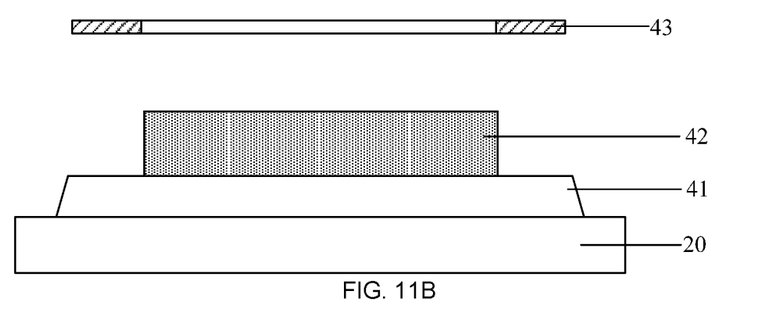
FIG. 11B is a second schematic diagram of a process of forming first conductive strips according to some embodiments of the present disclosure.
Figure 11C:
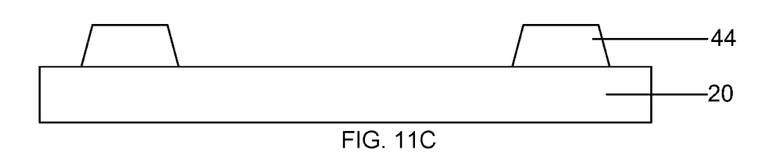
FIG. 11C is a third schematic diagram of a process of forming first conductive strips according to some embodiments of the present disclosure.

In some embodiments, as shown in FIG. 11C, the electrode lead 23 includes a single first conductive strip 44, and the gap 100 is disposed in a side face of the first conductive strip 44.

Figure 15:
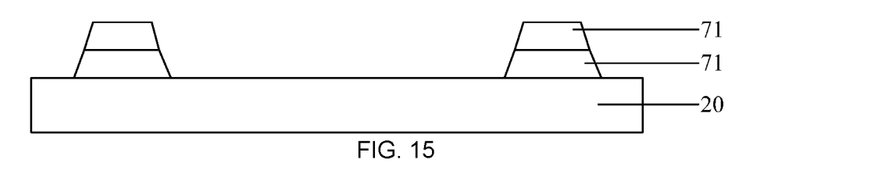
FIG. 15 is a schematic diagram of a display substrate according to some embodiments of the present disclosure.

In some other embodiments, as shown in FIG. 15, the electrode lead 23 includes a plurality of conductive strips 71 stacked on top of each other, and along a direction from the first electrode 21 to the substrate 20, densities of the plurality of conductive strips 71 gradually decrease. Of the plurality of conductive strips 71, at least two conductive strips 71 closest to the substrate are respectively provided with sub-gaps that are continuously distributed in side faces thereof, and the sub-gaps that are continuously distributed together form the gap 100.

In some examples, the densities of the plurality of conductive strips are, for example, made to gradually decrease along the direction from the first electrode 21 to the substrate 20 by using different conductive materials. In some other examples, the densities of the plurality of conductive strips are made to gradually decrease along the direction from the first electrode 21 to the substrate 20 by using different manufacturing processes. For example, in a case where the densities of the plurality of conductive strips are made to gradually decrease along the direction from the first electrode 21 to the substrate 20 by using different manufacturing processes, a plurality of conductive layers are sequentially formed on the substrate 20 by a magnetron sputtering process in which materials of the plurality of conductive layers are the same, and along the direction from the first electrode 21 to the substrate 20, a deposition pressure forming the plurality of conductive layers is gradually reduced.

Figure 13A:
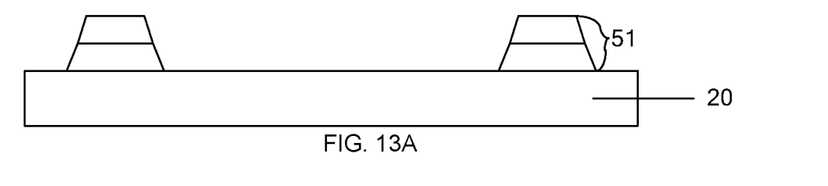
FIG. 13A is a first schematic diagram of another process of forming electrode leads each provided with a gap according to some embodiments of the present disclosure.
Figure 13B:
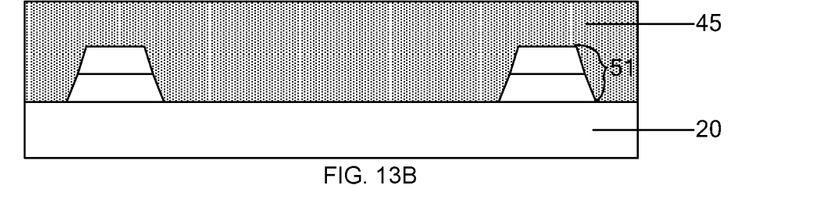
FIG. 13B is a second schematic diagram of another process of forming electrode leads each provided with a gap according to some embodiments of the present disclosure.

In some other embodiments, as shown in FIG. 13B, the electrode lead 23 includes a plurality of metal strips 51 stacked on top of each other, and along the direction from the first electrode 21 to the substrate 20, reducibility of metals in the plurality of metal strips 51 gradually decreases. Of the plurality of metal strips 51, at least two metal strips 51 closest to the substrate 20 are respectively provided with sub-gaps that are continuously distributed in side faces thereof, and the sub-gaps that are continuously distributed together form the gap 100.

Figure 14A:
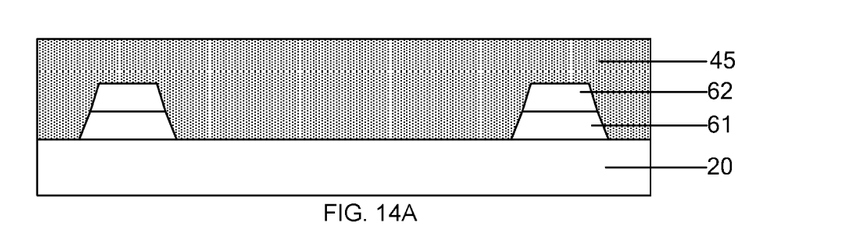
FIG. 14A is a first schematic diagram of yet another process of forming electrode leads each provided with a gap according to some embodiments of the present disclosure.

In some other embodiments, as shown in FIG. 14A, the electrode lead 23 includes an insulating strip 61 and at least one second conductive strip 62 that are stacked on top of each other, and the insulating strip is provided with a gap 100 in a side face thereof. A material of the insulating strip is, for example, $SiN_x$.

Figure 1:
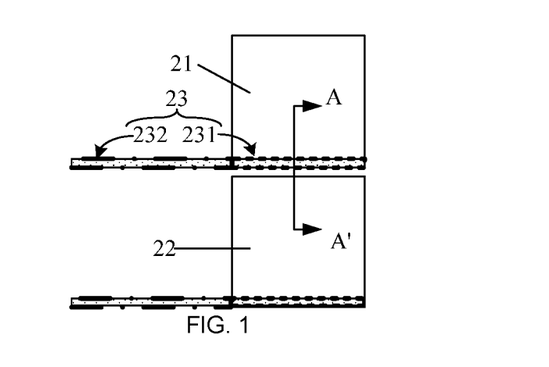
FIG. 1 is a plan view showing a partial structure of a display substrate according to some embodiments of the present disclosure, in which two electrodes are illustrated.

In some embodiments, as shown in FIG. 1, the electrode lead 23 further includes a second lead segment 232 in addition to the first lead segment 231, and the gap 100 extends from the first lead segment 231 to the second lead segment 232 along the extending direction of the electrode lead 23.

Since the gap 100 extends from the first lead segment 231 to the second lead segment 232 along the extending direction of the electrode lead 23, it may be known that the second lead segment 232 has a same shape as the first lead segment 231 though the second lead segment 232 and the first lead segment 231 have different lengths. Therefore, when a patterning process is adopted for forming the electrode lead 23, a manufacturing process of a mask plate may be simplified.

In some embodiments, the display substrate is a self-luminous display substrate. The self-luminous display substrate includes a first electrode layer, a luminous functional layer, and a second electrode layer including a plurality of electrodes that are sequentially arranged on the substrate 20. The plurality of electrodes in the second electrode layer are the plurality of electrode 200 including the first electrode 21 and the second electrode 22, so that the second electrode layer may be manufactured using a same manufacturing method as in manufacturing the first electrode 21 and the second electrode 22. The self-luminous display substrate is, for example, an organic light-emitting diode (OLED) self-luminous display substrate, or a quantum dot self-luminous display substrate.

Figure 8:
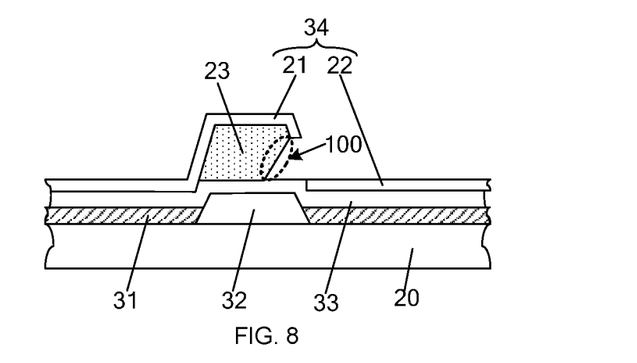
FIG. 8 is a side view showing a partial structure of a display substrate according to some embodiments of the present disclosure.

For example, as shown in FIG. 8, the self-luminous display substrate is an OLED self-luminous display substrate with a plurality of sub-pixel regions. The OLED self-luminous display substrate includes a pixel defining layer 32, a first electrode layer 31, a luminous functional layer 33, and a second electrode layer 34 that are sequentially arranged on the substrate 20. The pixel defining layer includes portions each disposed between adjacent sub-pixel regions. The first electrode layer 31 includes portions each disposed in a corresponding sub-pixel region. The luminous functional layer 33 is, for example, disposed in a whole layer. Alternatively, the luminous functional layer 33 includes portions each disposed in a corresponding sub-pixel region.

In some examples, the OLED self-luminous display substrate is applied to a display device, and a light-emitting mode of the display device is selected from a group consisting of a bottom light-emitting mode in which only the first electrode layer 31 transmits light, a top light-emitting mode in which only the second electrode layer 34 transmits light, and a two-sided light-emitting mode in which both the first electrode layer 31 and the second electrode layer 34 transmit light.

In some embodiments, the second electrode layer 34 of the self-luminous display substrate also serves as a touch electrode layer, and the electrode lead 23 also serves as a touch electrode lead 23. In this way, the manufacturing process is simplified. In addition, when the display substrate is applied to a display device, an overall thickness of the display device may be reduced It will be noted that, the touch electrode layer includes a plurality of mutually insulated touch electrodes, and in a case where the electrodes 200 including first electrode 21 and the second electrode 22 are the touch electrodes of the touch electrode layer, each touch electrode is electrically connected to one or more touch electrode leads. For example, as shown in FIG. 7A, a single first electrode 21 (or a single second electrode 22) is electrically connected to two electrode leads 23. In a case where cross sectional areas of touch electrode leads are the same, electrically connecting one touch electrode to two touch electrode leads may further reduce IR drop on the touch electrode and load. When the display substrate is applied to a display device, a display performance and touch effect of the display device may be further improved.

Figure 7B:
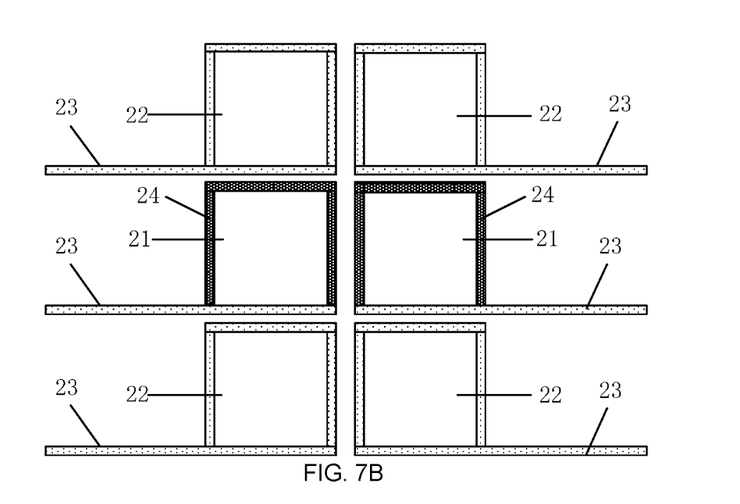
FIG. 7B is a plan view showing a partial structure of a display substrate according to some embodiments of the present disclosure, in which insulating lines are illustrated.

In some embodiments, the first electrode 21 and the second electrode 22 are used as touch electrodes, and a portion of an electrode lead 23 electrically connected to each touch electrode is provided to encircle the touch electrode to define the boundary of the touch electrode, so that touch electrodes of the touch electrode layer are mutually insulated. For example, as shown in FIG. 7B, the second electrode 22 is used as a touch electrode, and a portion of an electrode lead 23 electrically connected to each second electrode 22 is provided to encircle the second electrode 22 to define the boundary of the second electrode 22, so that second electrodes 22 of the touch electrode layer are mutually insulated.

However, in a case where touch electrodes of the touch electrode layer may not be mutually insulated through the touch electrode leads electrically connected to the touch electrodes (for example, only one edge of the first electrode 21 is in direct contact with the electrode lead 23), the display substrate further includes insulating lines 24, each of which surrounds a touch electrode which is not surrounded by the portion of the electrode lead 23, so that touch electrodes of the touch electrode layer are mutually insulated through the definition of the insulating lines 24 and the touch electrode leads 23. For example, as shown in FIG. 7B, an insulating line 24 surrounds three edges of the first electrode 21 which are not surrounded by the portion of the electrode lead 23, that is, the insulating line 24 is in direct contact with three edges of the first electrode 21 which are not in contact with the electrode lead 23.

When using the electrode leads to define the touch electrodes, a touch electrode lead electrically connected to any touch electrode cannot be electrically connected to other touch electrodes, or other touch electrode leads electrically connected with other touch electrodes.

In addition, considering that the touch electrode lead is usually made of a metal material, when the thickness of the touch electrode lead is large, the transmittance of the light is low. Therefore, in some embodiments, the touch electrode lead is disposed between adjacent sub-pixel regions, such that the aperture ratio of the substrate is not affected by the touch electrode lead.

Figure 10:
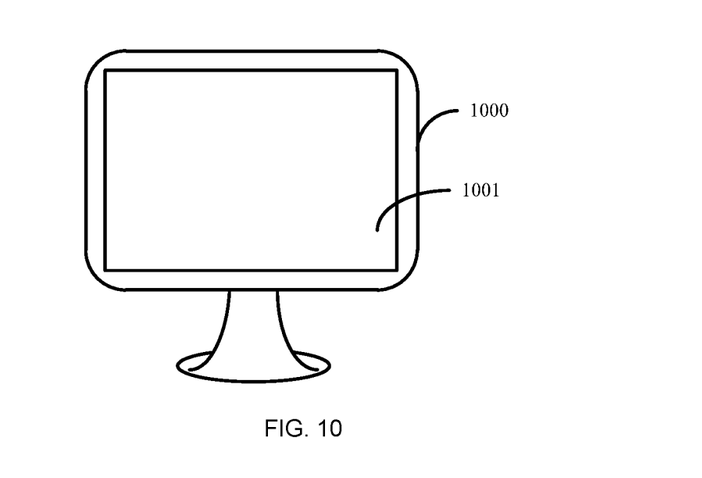
FIG. 10 is a schematic diagram of a display device according to some embodiments of the present disclosure.

As shown in FIG. 10, some embodiments of the present disclosure provide a display device 1000, and the display device 1000 includes the display substrate 1001 described above. For example, the display device 1000 further includes other structures suitable for use, such as a drive circuit board, a frame, etc. The display device 1000 is, for example, a display panel, or a display including a display panel, such as, a liquid crystal display, an OLED display, a quantum dot display, an electronic paper, a mobile phone, a tablet computer, a television, a displayer, a notebook computer, a digital photo frame, a navigator, or any other products or components having display and touch functions.

The display device has the same technical effects as the display substrate described above, and details are not described herein again.

In some embodiments, a method of manufacturing a display substrate is provided. The display substrate is, for example, the display substrate described above. The method includes following steps 10 and 20 (S10 and S20).

In S10, a plurality of electrode leads 23 are formed on the substrate 20, and a gap is formed in each of at least one of the plurality of electrode leads 23.

In some examples, the plurality of electrode leads 23 are formed by using a single layer of conductive thin film or multiple layers of conductive thin films. In some other examples, the plurality of electrode leads 23 are formed by using multiple layers of metal thin films. In some other examples, the plurality of electrode leads 23 are formed by using a layer of insulating thin film and at least one layer of conductive thin film.

S20, a plurality of electrodes 21, 22 are formed on the substrate 20 formed with the plurality of electrode leads 23, wherein each electrode 21, 22 is in direct contact with one or more of the plurality of electrode leads 23, a thickness of each electrode lead 23 is greater than a thickness of a corresponding one of the plurality of electrode 21, 22, and one of the plurality of electrodes in direct contact with a corresponding one of the plurality of electrode leads is electrically disconnected from another one of the plurality of electrodes adjacent to the corresponding one of the plurality of electrode leads.

In some embodiments, technologies such as evaporation, vapor deposition and magnetron sputtering are used to form the plurality of electrodes 21, 22. In some embodiments, each electrode lead 23 is provided with a gap 100. In this way, an electrode material layer formed on the substrate 20 by evaporation, vapor deposition or magnetron sputtering will be electrically disconnected at the position of the gaps 100, thereby forming the plurality of electrodes 21, 22 separated from each other.

The display substrate described above may be obtained by the method of manufacturing the display substrate provided by the embodiments of the present disclosure. Therefore, the method has the same technical effects as the display substrate described above, and details are not described herein again.

Several methods of forming at least one gap each in a corresponding one of at least one of the plurality of electrode leads 23 in S10 are described below. It will be noted that the method of forming the at least one gap is not limited to these methods, and other methods can also be used according to actual needs.

A First Method

In some embodiments, forming at least one gap each in a corresponding one of at least one of the plurality of electrode leads 23 includes following steps (S101~S103).

In S101, as shown in FIG. 11A, a single layer of conductive thin film 41 is formed on the substrate 20, and the conductive thin film 41 is etched to form first conductive strips 44, as shown in FIG. 11C.

After forming the single layer of conductive thin film 41 on the substrate 20, as shown in FIG. 11B, a layer of photoresist is formed on the layer of conductive thin film 41, and the photoresist is exposed and developed by using a mask plate 43 to make the photoresist form photoresist patterns 42 as shown in FIG. 11B. Next, the conductive thin film 41 is etched to form the first conductive strips 44. In addition to the first conductive strips 44, other structures may also be formed on the substrate 20. The conductive thin film 41 is, for example, etched by wet etching.

Each first conductive strip 44 includes two opposite side faces parallel to an extending direction of the first conductive strip 44.

FIGS. 11A, 11B and 11C are all schematic diagrams by taking an example in which a single layer of conductive thin film 41 is formed. It will be understood that multiple layers of conductive thin films may also be formed on the substrate 20.

In a case where multiple layers of conductive thin films are formed on the substrate 20, a thickness of each layer of conductive thin film may be adjusted according to a required height of the gap 100. In some examples, the densities of the multiple layers of conductive thin films 41 are made to gradually decrease along the direction from the first electrode 21 to the substrate 20 by using different conductive materials. In some other examples, the densities of the multiple layers of conductive thin films 41 are made to gradually decrease along the direction from the first electrode 21 to the substrate 20 by using different manufacturing processes. In a case where the densities of the multiple layers of conductive thin films 41 are made to gradually decrease along the direction from the first electrode 21 to the substrate 20 by using different manufacturing processes, the multiple layers of conductive thin films 41 may be sequentially formed on the substrate 20 by a magnetron sputtering process in which materials of the multiple layers of conductive thin films 41 are the same, and along the direction from the first electrode 21 to the substrate 20, a deposition pressure forming the multiple layers of conductive thin films 41 is gradually reduced. An etching degree of wet etching is substantially the same for conductive thin films 41 with different densities.

Figure 12A:
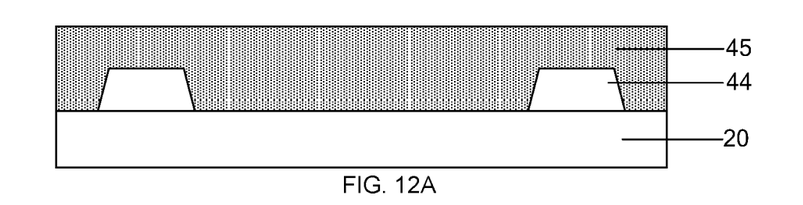
FIG. 12A is a first schematic diagram of a process of forming electrode leads each provided with a gap according to some embodiments of the present disclosure.
Figure 12B:
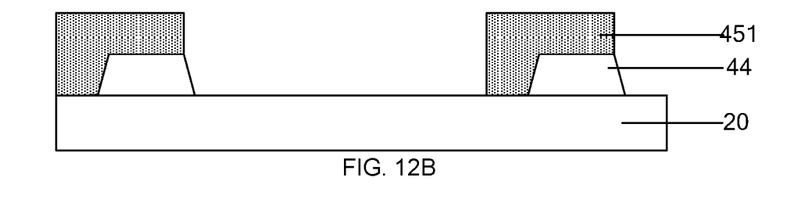
FIG. 12B is a second schematic diagram of a process of forming electrode leads each provided with a gap according to some embodiments of the present disclosure.

In S102, a layer of photoresist 45 is formed on the substrate 20 formed with the first conductive strips 44, as shown in FIG. 12A, and the photoresist 45 is exposed and developed to form photoresist patterns 451, as shown in FIG. 12B. Each of at least one of the photoresist patterns 451 covers a portion of a corresponding first conductive strip 44 in which a gap 100 does not need to be formed, and exposes a portion of the corresponding first conductive strip 44 in which a gap 100 needs to be formed.

Each of at least one of the photoresist patterns 451 covers at least a surface of a corresponding first conductive strip 44 facing away from the substrate 20 and one of the two opposite side faces of the corresponding first conductive strip 44, and exposes at least a portion of an opposite side face of the two opposite side faces of the corresponding first conductive strip 44. The photoresist 45 is, for example, a positive photoresist or a negative photoresist.

It will be noted that, the photoresist pattern 451 in S102 is different from the photoresist pattern 42 in S101.

In S103, at least one first conductive strip 44 respectively coved by the at least one of the photoresist patterns 451 is etched to form the at least one gap 100.

Although description of this step is etching the first conductive strip 44, it will be understood that, in the case where a corresponding photoresist pattern 451 covers at least the surface of the first conductive strip 44 facing away from the substrate 20 and one of the two opposite side faces of the first conductive strip 44, and the corresponding photoresist pattern 451 exposes at least a portion of the opposite side face of the two opposite side faces of the first conductive strip 44, "etching the first conductive strip 44" actually means etching the at least a portion of the opposite side face of the two opposite side faces of the first conductive strip 44 that is exposed.

In some embodiments, the first conductive strip 44 is etched by dry etching after forming a layer of conductive thin film 41 on the substrate 20. Dry etching is ion bombardment of the first conductive strip 44 from a side of the first conductive strip 44 away from the substrate 20 along a direction from the first conductive strip 44 to the substrate 20. A portion of the first conductive strip 44 that is closer to the photoresist pattern 451 is less likely to be bombarded by ions. Therefore, a gap 100 as shown in FIG. 3 will be formed, and a surface defining the gap 100 in the first conductive strip 44 is an inclined surface.

On this basis, if an ion bombardment energy on a portion of the first conductive strip 44 away from the photoresist pattern 451 is reduced, the gap 100 as shown in FIG. 5 will be formed, and the surface defining the gap 100 in the first conductive strip 44 is a curved surface that is arched toward the first side face 2311.

When forming multiple layers of conductive thin films on the substrate 20, a dry etching speed of a conductive material having a small density is fast, and a dry etching speed of a conductive material having a large density is slow. In the dry etching process, the first conductive strip is ion bombarded from the side of the first conductive strip away from the substrate 20 in the direction from the first conductive strip to the substrate 20, and thus the portion of the first conductive strip that is closer to the photoresist pattern 451 is less likely to be bombarded by ions. Therefore, the gap 100 as shown in FIG. 2 will be formed, and a surface defining the gap 100 in the first conductive strip is an inclined surface.

On this basis, if an ion bombardment energy on the portion of the first conductive strip away from the photoresist pattern 451 is reduced, the gap 100 as shown in FIG. 4 will be formed, and the surface defining the gap 100 in the first conductive strip is a curved surface that is arched toward the first side face 2311.

The first method has a simple manufacturing process and a low manufacturing cost.

A Second Method

In some embodiments, forming at least one gap each in a corresponding one of at least one of the plurality of electrode leads 23 includes the following steps (S111-S113).

In S111, multiple layers of metal thin films are formed on the substrate 20, and the multiple layers of metal thin films are etched to form metal strips 51 as shown in FIG. 13A.

Each of the metal strips 51 includes two opposite side faces parallel to an extending direction thereof, and along the direction from the first electrode 21 to the substrate 20, reducibility of the multiple layers of metal thin films gradually increases.

In some embodiments, a thickness of each of the multiple layers of metal thin films is adjusted according to a required height of the gap 100.

In some embodiments, the multiple layers of metal thin films are etched by dry etching. An etching degree of dry etching is basically the same for metal films with different reducing properties. FIGS. 11A, 11B, and 110 may be referred to for a process of etching the multiple layers of metal thin films to form metal strips 51 by dry etching, and details are not described herein again.

In addition to the metal strip 51, other structures may also be formed on the substrate 20.

Figure 13C:
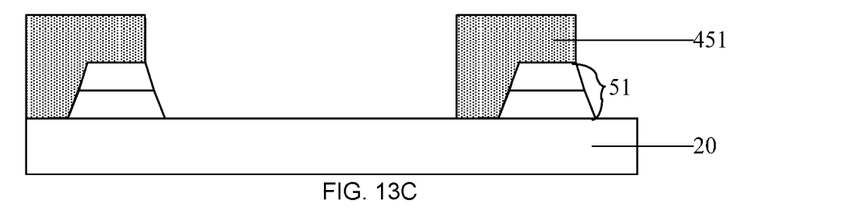
FIG. 13C is a third schematic diagram of another process of forming electrode leads each provided with a gap according to some embodiments of the present disclosure.

In S112, a layer of photoresist 45 is formed on the substrate 20 on which the metal strips 51 have been formed, as shown in FIG. 13B, and the photoresist 45 is exposed and developed to form photoresist patterns 451, as shown in FIG. 13C. Each of at least one of the photoresist patterns 451 covers a portion of a corresponding metal strip 51 in which a gap 100 does not need to be formed, and exposes a portion of the corresponding metal strip 51 in which a gap 100 needs to be formed.

Each of the at least one of the photoresist patterns 451 covers at least one of the two opposite side faces of the corresponding metal strip 51 and a surface of the corresponding metal strip 51 away from the substrate 20, and the photoresist pattern 451 exposes at least a portion of another side face of the two opposite side faces of the corresponding metal strip 51.

The photoresist 45 may be a positive photoresist or a negative photoresist.

In S113, at least one metal strip 51 respectively covered by the at least one of the photoresist patterns 451 is etched to form the at least one gap 100.

Although description of this step is etching the metal strip 51, it will be understood that, in the case where the photoresist pattern 451 covers at least one of the two opposite side faces of the metal strip 51 and the surface of the metal strip 51 away from the substrate 20, and the photoresist pattern 451 exposes at least a portion of the other side face of the two opposite side faces of the metal strip 51, "etching the metal strip 51" actually means etching the at least a portion of the other side face of the two opposite side faces of the metal strip 51 that is exposed.

The metal strip 51 may be etched by wet etching. Wet etching is to place the substrate to be etched in a container having an etching liquid, so that the metal strip 51 on the substrate 20 reacts with the etching liquid. The stronger the reducibility of the metal, the more intense the reaction of the metal with the etching liquid. Since along the direction from the first electrode 21 to the substrate 20, reducibility of the multiple layers of metal thin films gradually increases, an etching speed of a portion of the metal strip 51 close to the substrate 20 is faster than an etching speed of a portion of the metal strip 51 away from the substrate 20. Therefore, the gap 100 as shown in FIG. 2 will be formed, and a surface defining the gap 100 on the metal strip 51 is an inclined surface.

The second method has a simple manufacturing process.

A Third Method

In some embodiments, forming at least one gap each in a corresponding one of at least one of the plurality of electrode leads 23 includes the following steps (S121-S123).

In S121, a layer of insulating thin film and at least one layer of conductive thin film are sequentially formed on the substrate 20, the at least one layer of conductive thin film is etched to form second conductive strips 62, as shown in FIG. 14A, and the insulating thin film is etched to form insulating strips 61. Each second conductive strip 62 is located on a side of a corresponding insulating strip 61 away from the substrate 20.

A shape of the second conductive strip 62 is, for example, similar to a shape of the insulating strip 61. The second conductive strip 62 and the insulating strip 61 each include two opposite side faces parallel to an extending direction thereof.

A thicknesses of the insulating thin film and the at least one layer of conductive thin film may be adjusted according to a required height of the gap 100.

FIGS. 11A, 11B, and 11C may be referred to for a process of etching the conductive thin films to form second conductive strips 62 and a process of etching the insulating thin film to form insulating strips 61, and details are not described herein again.

In addition to the second conductive strips 62 and the insulating strips 61, other structures may also be formed on the substrate 20.

Figure 14B:
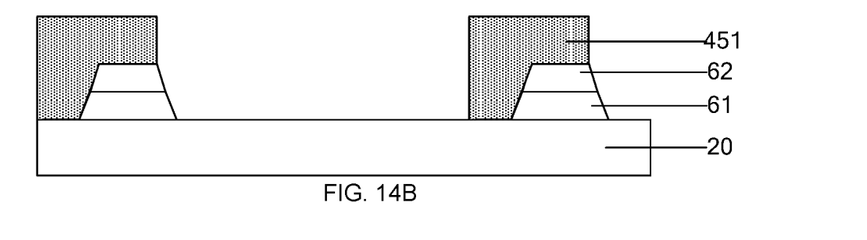
FIG. 14B is a second schematic diagram of yet another process of forming electrode leads each provided with a gap according to some embodiments of the present disclosure.

In S122, a layer of photoresist 45 is formed on the second conductive strip 62, as shown in FIG. 14A, and the photoresist 45 is exposed and developed to form photoresist patterns 451 as shown in FIG. 14B. Each of at least one of the photoresist patterns 451 covers a portion of a corresponding second conductive strip 62 and a portion of a corresponding insulating strip 61 in which a gap 100 does not need to be formed, and exposes a portion of the corresponding second conductive strip 62 and a portion of the corresponding insulating strip 61 in which a gap 100 needs to be formed.

Each of at least one of the photoresist patterns 451 covers at least one of the two opposite side faces of a corresponding insulating strip 61 and one of the two opposite side faces of a corresponding second conductive strip 62, and a surface of the corresponding second conductive strip 62 away from the substrate 20, and this photoresist pattern 451 exposes at least a portion of another side face of the two opposite side faces of the corresponding insulating strip 61.

The photoresist 45 is, for example, a positive photoresist or a negative photoresist.

S123, at least one insulating strip 61 respectively coved by the at least one of the photoresist patterns 451 is etched to form at least one gap 100.

Although description of this step is etching the insulating strip 61, it will be understood that, in the case where a corresponding photoresist pattern 451 covers at least one of the two opposite side faces of the insulating strip 61 and one of the two opposite side faces of the second conductive strip 62, and the surface of the second conductive strip 62 away from the substrate 20, and the corresponding photoresist pattern 451 exposes at least a portion of the other side face of the two opposite side faces of the insulating strip 61, "etching the insulating strip 61" actually means etching the at least a portion of the other side face of the two opposite side faces of the insulating strip 61 that is exposed.

The insulating strip 61 is, for example, etched by dry etching. Dry etching is ion bombardment of the insulating strip 61 from a side of the second conductive strip 62 away from the substrate 20 along a direction from the second conductive strip 62 to the substrate 20. Since a material used for etching the insulating strip 61 is different from a material used for etching the conductive strip 62, when etching the insulating strip 61, the second conductive strip 62 will not be etched, and the second conductive strip 62 is able to shield a portion of the insulating strip 61 close to the second conductive strip 62 from an etching material. Therefore, the gap 100 as shown in FIG. 2 will be formed, and a surface defining the gap 100 on the insulating strip 61 is an inclined surface.

On this basis, if an ion bombardment energy on the portion of the insulating strip 61 away from the second conductive strip 62 is reduced, the gap 100 as shown in FIG. 4 will be formed, and the surface defining the gap 100 on the insulating strip 61 is a curved surface that is arched toward the first side face 2311.

The third method has a simple manufacturing process and a low manufacturing cost.

In the above description of the embodiments, specific features, structures, materials or characteristics may be combined in any suitable manner in any one or more embodiments or examples.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display substrate, comprising:
   a substrate;
   a plurality of electrode leads disposed on the substrate; and
   a plurality of electrodes electrically disconnected with each other disposed on the substrate, each electrode being in direct contact with one or more of the plurality of electrode leads, a thickness of each electrode lead being greater than a thickness of a corresponding electrode,
   wherein at least one of the plurality of electrode leads is respectively provided with at least one gap in a thickness direction of the at least one of the plurality of electrode leads, and each gap is configured to electrically disconnect one of the plurality of electrodes that is in direct contact with a corresponding electrode lead from another one of the plurality of electrodes that is adjacent to the corresponding electrode lead.

2. The display substrate according to claim 1, wherein each of the at least one of the plurality of electrode leads comprises a first side face and a second side face opposite to each other, and a first surface disposed facing away from the substrate, and the first side face and the second side face are parallel to a length direction of a corresponding electrode lead;
   an edge portion of an electrode in direct contact with the corresponding electrode lead covers the first side face and the first surface; and
   the gap is provided in the second side face.

3. The display substrate according to claim 2, wherein each of the at least one of the plurality of electrode leads further comprises a second surface adjacent to the substrate, and an edge of the gap close to the substrate is located on the second surface.

4. The display substrate according to claim 2, wherein,
   an edge of the gap away from the substrate is located on the first surface; or
   there is a distance between the edge of the gap away from the substrate and the first surface.

5. The display substrate according to claim 2, wherein a surface defining the gap in each of the at least one of the plurality of electrode leads is a flat surface or a curved surface.

6. The display substrate according to claim 5, wherein
   the surface defining the gap in each of the at least one of the plurality of electrode leads is a curved surface, and the curved surface comprises a first sub-curved surface and a second sub-curved surface;
   from an edge of the first sub-curved surface away from the substrate to an edge of the first sub-curved surface close to the substrate, the first sub-curved surface extends gradually in a direction away from a reference plane, wherein the reference plane is a plane passing through an edge of the gap away from the substrate and perpendicular to the substrate;
   from an edge of the second sub-curved surface close to the substrate to an edge of the second sub-curved surface away from the substrate, the second sub-curved surface extends gradually in the direction away from the reference plane.

7. The display substrate according to claim 1, wherein each of the plurality of electrode leads comprises a single first conductive strip, and the gap is disposed in a side face of the first conductive strip.

8. The display substrate according to claim 1, wherein each of the plurality of electrode leads comprises a plurality of conductive strips stacked on top of each other;
   along a direction from a corresponding electrode to the substrate, densities of the plurality of conductive strips gradually decrease;
   of the plurality of conductive strips, at least two conductive strips closest to the substrate are respectively provided with sub-gaps that are continuously distributed in side faces thereof, and the sub-gaps that are continuously distributed together form the gap.

9. The display substrate according to claim 1, wherein each of the plurality of electrode leads comprises a plurality of metal strips stacked on top of each other;
   along a direction from a corresponding electrode to the substrate, reducibility of metals in the plurality of metal strips gradually increases; and
   of the plurality of metal strips, at least two metal strips closest to the substrate are respectively provided with sub-gaps that are continuously distributed in side faces thereof, and the sub-gaps that are continuously distributed together form the gap.

10. The display substrate according to claim 1, wherein each of the plurality of electrode leads comprises an insulating strip and at least one second conductive strip that are stacked on top of each other, and the insulating strip is provided with the gap on a side face thereof.

11. The display substrate according to claim 1, wherein a ratio of resistivity to thickness of each electrode lead is smaller than a ratio of resistivity to thickness of an electrode in direct contact with the electrode lead.

12. The display substrate according to claim 1, wherein in a thickness direction of the substrate, a height of the gap is 1000-4000 Å, and a thickness of each electrode is 100-150 Å.

13. The display substrate according to claim 1, wherein the display substrate is a self-luminous display substrate;
the self-luminous display substrate comprises a first electrode layer, a luminous functional layer, a second electrode layer that are sequentially arranged on the substrate; and
the plurality of electrodes are electrodes in the second electrode layer.

14. The display substrate according to claim 13, wherein the second electrode layer also serves as a touch electrode layer, and the plurality of electrode leads also serve as touch electrode leads.

15. A display device, comprising the display substrate according to claim 1.

16. A method of manufacturing the display substrate according to claim 1, comprising:
forming a plurality of electrode leads on the substrate;
forming at least one gap each in a corresponding one of at least one of the plurality of electrode leads, wherein the at least one gap is in a thickness direction of the at least one of the plurality of electrode leads; and
forming a plurality of electrodes on the substrate formed with the plurality of electrode leads, wherein each electrode is in direct contact with one or more of the plurality of electrode leads, the thickness of each electrode lead is greater than a thickness of a corresponding electrode, and one of the plurality of electrodes that is in direct contact with the corresponding one of the at least one of the plurality of electrode leads is electrically disconnected from another one of the plurality of electrodes that is adjacent to the corresponding one of the at least one of the plurality of electrode leads.

17. The method of manufacturing the display substrate according to claim 16, wherein forming at least one gap each in a corresponding one of at least one of the plurality of electrode leads, comprises:
forming a single layer of conductive thin film or multiple layers of conductive thin films on the substrate, and etching the conductive thin film(s) to form first conductive strips;
forming a layer of photoresist on the substrate formed with the first conductive strips, wherein the photoresist covers a portion of each of at least one of first conductive strips in which a gap does not need to be formed, and exposes another portion thereof in which a gap needs to be formed; and
etching the at least one of the first conductive strips to form the at least one gap.

18. The method of manufacturing the display substrate according to claim 16, wherein forming at least one gap each in a corresponding one of at least one of the plurality of electrode leads comprises:
forming multiple layers of metal thin films on the substrate, and etching the multiple layers of metal thin films to form metal strips;
forming a layer of photoresist on the substrate formed with the metal strips, wherein the photoresist covers a portion of each of at least one of the metal strips in which a gap does not need to be formed, and exposes another portion thereof in which a gap needs to be formed;
etching the at least one of the metal strips to form the at least one gap.

19. The method of manufacturing the display substrate according to claim 16, wherein forming at least one gap each in a corresponding one of at least one of the plurality of electrode leads comprises:
sequentially forming a layer of insulating thin film and at least one layer of conductive thin film on the substrate, etching the at least one layer of conductive thin film to form second conductive strips, and etching the insulating thin film to form insulating strips, wherein each second conductive strip is located on a side of a corresponding insulating strip away from the substrate;
forming a layer of photoresist on the substrate formed with the second conductive strips, wherein the photoresist covers a portion of each of at least one of the second conductive strips and a portion of a corresponding one of at least one of the insulating strips in which a gap does not need to be formed, and exposes another portion of each of the at least one of the second conductive strips and a portion of the corresponding one of the at least one of the insulating strips in which a gap needs to be formed; and
etching the at least one of the insulating strips to form the at least one gap.

* * * * *